US012604575B2

(12) United States Patent
Wu

(10) Patent No.: US 12,604,575 B2
(45) Date of Patent: Apr. 14, 2026

(54) DISPLAY MODULE WITH BETTER STRUCTURAL YIELD

(71) Applicant: Qisda Corporation, Taoyuan City (TW)

(72) Inventor: Po-Fu Wu, Taoyuan City (TW)

(73) Assignee: Qisda Corporation, Taoyuan City (TW)

( * ) Notice: Subject to any disclaimer, the term of this patent is extended or adjusted under 35 U.S.C. 154(b) by 443 days.

(21) Appl. No.: 18/183,967

(22) Filed: Mar. 15, 2023

(65) Prior Publication Data

US 2024/0021760 A1 Jan. 18, 2024

(30) Foreign Application Priority Data

Jul. 14, 2022 (CN) .......................... 202210831462.2

(51) Int. Cl.
| | |
|---|---|
| *H10H 20/853* | (2025.01) |
| *H01L 25/075* | (2006.01) |
| *H10H 20/854* | (2025.01) |
| *H10H 20/855* | (2025.01) |
| *H10H 20/01* | (2025.01) |

(52) U.S. Cl.
CPC ....... *H10H 20/853* (2025.01); *H01L 25/0753* (2013.01); *H10H 20/854* (2025.01); *H10H 20/855* (2025.01); *H10H 20/0362* (2025.01)

(58) Field of Classification Search
CPC .......................... H01L 25/0753; H10H 29/142; H10H 20/854; H10H 20/0362

USPC ....................................................... 257/99–100
See application file for complete search history.

(56) References Cited

U.S. PATENT DOCUMENTS

| | | | | |
|---|---|---|---|---|
| 2011/0193114 A1* | 8/2011 | Lerman | ..................... | F21K 9/20 |
| | | | | 257/91 |
| 2014/0027709 A1* | 1/2014 | Higginson | ......... | H10D 86/0212 |
| | | | | 438/26 |
| 2015/0370130 A1* | 12/2015 | Lin | ........................ | G09F 19/226 |
| | | | | 349/69 |
| 2019/0258346 A1* | 8/2019 | Cheng | ..................... | H10D 86/40 |
| 2021/0147290 A1* | 5/2021 | Tokunaga | ............... | C03C 19/00 |

FOREIGN PATENT DOCUMENTS

| | | |
|---|---|---|
| CN | 110176190 | 8/2019 |
| CN | 110956902 | 4/2020 |

* cited by examiner

*Primary Examiner* — Ratisha Mehta
*Assistant Examiner* — Mikka Liu

(57) ABSTRACT

A display module includes a driving substrate, a plurality of light-emitting diode (LED) lamp boards, a transparent cover and a blocking structure. The LED lamp boards are separately disposed on the driving substrate separately. The transparent cover is disposed on the driving substrate and has a plurality of accommodating grooves. The LED lamp boards correspond to the accommodating grooves respectively and are disposed at intervals. The blocking structure is disposed on the transparent cover and located between the transparent cover and the driving substrate. The LED lamp boards and the blocking structure are disposed at intervals.

10 Claims, 5 Drawing Sheets

DISPLAY MODULE WITH BETTER STRUCTURAL YIELD

CROSS-REFERENCE TO RELATED APPLICATION

This application claims the priority benefit of Chinese application no. 202210831462.2, filed on Jul. 14, 2022. The entirety of the above-mentioned patent application is hereby incorporated by reference herein and made a part of this specification.

BACKGROUND

Technical Field

The disclosure relates to a display module and a manufacturing method thereof, and particularly relates to a display module with better structural yield and a manufacturing method thereof.

Description of Related Art

In a current direct view light-emitting diode (dvLED) display device, when light-emitting diode (LED) lamp boards are placed on a driving substrate with surface mount technology (SMT), two times of dispensing and encapsulation operations are sequentially performed. The first dispensing of black glue is to fill in gaps, so as to avoid cross-light interference generated between the LED lamp boards, and achieve a function of fixing and improving contrast. The second dispensing of transparent glue is to protect the LED lamp boards, so that the LED lamp boards may be waterproof, dust-proof, impact protection, etc. The above-mentioned two times of dispensing operations are performed sequentially on the light-emitting diode lamp boards, i.e., through an on-line operation, and an operation time is relatively long, which easily affects a production time and output efficiency. Moreover, the black glue may be splashed on light-emitting surfaces of the LED lamp boards, which requires expensive plasma cleaning equipment for cleaning. In addition, both of the black glue and the transparent glue are in direct contact with the LED lamp boards when they are filled. Therefore, when the black glue and the transparent glue are cured, a shrinkage stress of the glue may cause peeling-off of the LED lamp boards or deformation of the driving substrate. Moreover, after the glue is cured, if the LED lamp boards are damaged or needs to be repaired, rework will become very difficult.

SUMMARY

The disclosure is directed to a display module, which has better structural yield.

The disclosure is directed to a manufacturing method of a display module, which is used to manufacture the above-mentioned display module, and has better production efficiency.

The disclosure provides a display module including a driving substrate, a plurality of light-emitting diode (LED) lamp boards, a transparent cover and a blocking structure. The LED lamp boards are separately disposed on the driving substrate. The transparent cover is disposed on the driving substrate and has a plurality of accommodating grooves. The LED lamp boards respectively correspond to the accommodating grooves and are disposed at intervals. The blocking structure is disposed on the transparent cover and located between the transparent cover and the driving substrate. The LED lamp boards and the blocking structure are disposed at intervals.

In an embodiment of the disclosure, the blocking structure is further extended on inner walls of the accommodating grooves.

In an embodiment of the disclosure, the display module further includes an adhesive layer disposed between the blocking structure and the driving substrate.

In an embodiment of the disclosure, a cross-sectional shape of each of the accommodating grooves includes a rectangle, a regular trapezoid, an inverted trapezoid, a triangle, a semicircle, or a semiellipse.

In an embodiment of the disclosure, a thickness of each of the LED lamp boards is H, and a thickness of the transparent cover is within a range of 0.1H to 10H.

In an embodiment of the disclosure, a thickness of each of the LED lamp boards is H, and a thickness of the blocking structure is within a range of 0.7H to 2H.

In an embodiment of the disclosure, a length of each of the LED lamp boards is W, and a gap between the blocking structure and a side of each of the LED lamp boards is less than or equal to 0.3 W.

In an embodiment of the disclosure, a material of the transparent cover includes epoxy resin or silicone glue.

In an embodiment of the disclosure, a material of the blocking structure includes epoxy resin, silicon glue, or acrylic glue.

In an embodiment of the disclosure, each of the LED lamp boards includes a micro LED lamp board or a mini LED lamp board.

The disclosure provides a manufacturing method of a display module including the following. A driving substrate and a plurality of LED lamp boards are provided. The LED lamp boards are separately disposed on the driving substrate. A transparent cover is provided. The transparent cover has a plurality of accommodating grooves. A blocking structure is formed on the transparent cover. The transparent cover is assembled on the driving substrate. The LED lamp boards respectively correspond to the accommodating grooves and are disposed at intervals. The blocking structure is located between the transparent cover and the driving substrate. The LED lamp boards and the blocking structure are disposed at intervals.

In an embodiment of the disclosure, the transparent cover is formed by molding.

In an embodiment of the disclosure, forming the blocking structure on the transparent cover includes the following. A blocking material is provided. The blocking material is adhered to the transparent cover. The blocking material adhered to the transparent cover is cured and the blocking structure is formed on the transparent cover. The blocking structure is further extended on inner walls of the accommodating grooves.

In an embodiment of the disclosure, the blocking structure is formed on the transparent cover by molding.

In an embodiment of the disclosure, the manufacturing method further includes the following. An adhesive layer is provided on the driving substrate or the blocking structure before the transparent cover is assembled on the driving substrate.

In an embodiment of the disclosure, a cross-sectional shape of each of the accommodating grooves includes a rectangle, a regular trapezoid, an inverted trapezoid, a triangle, a semicircle, or a semiellipse.

In an embodiment of the disclosure, a thickness of each of the LED lamp boards is H, and a thickness of the transparent cover is within a range of 0.1H to 10H.

In an embodiment of the disclosure, a thickness of each of the LED lamp boards is H, and a thickness of the blocking structure is within a range of 0.7H to 2H.

In an embodiment of the disclosure, a length of each of the LED lamp boards is W, and a gap between the blocking structure and a side of each of the LED lamp boards is less than or equal to 0.3 W.

In an embodiment of the disclosure, each of the LED lamp boards includes a micro LED lamp board or a mini LED lamp board.

Based on the above description, in the design of the display module of the disclosure, the LED lamp boards respectively correspond to the accommodating grooves of the transparent cover and are arranged at intervals, and the LED lamp boards and the blocking structure disposed on the transparent cover are arranged at intervals. Namely, neither the transparent cover nor the blocking structure is in contact with the LED lamp boards, and will not damage the LED lamp boards, and will not affect the luminous efficiency of the LED lamp boards, thereby improving a structural yield of the display module of the disclosure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
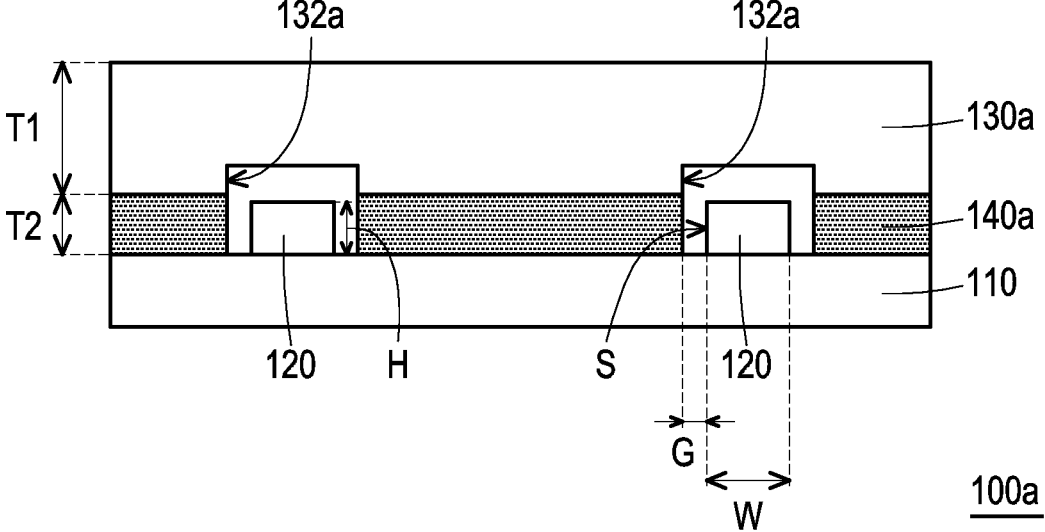
FIG. 1 is a schematic diagram of a display module according to an embodiment of the disclosure.

FIG. 1 is a schematic diagram of a display module according to an embodiment of the disclosure. Referring to FIG. 1, in the embodiment, a display module 100a includes a driving substrate 110, a plurality of light-emitting diode (LED) lamp boards 120, a transparent cover 130a and a blocking structure 140a. The LED lamp boards 120 are separately disposed on the driving substrate 110. The transparent cover 130a is disposed on the driving substrate 110 and has a plurality of accommodating grooves 132a. The LED lamp boards 120 respectively correspond to the accommodating grooves 132a and are arranged at intervals. The blocking structure 140a is disposed on the transparent cover 130a and located between the transparent cover 130a and the driving substrate 110. The LED lamp boards 120 and the blocking structure 140a are arranged at intervals.

In detail, in the embodiment, the display module 100a is, for example, a direct-type display module. In response to the demand for reducing a pixel spacing and a viewing distance, the LED lamp boards 120 adopt micro LEDs or mini LEDs. In other words, each LED lamp board 120 of the embodiment is, for example, a micro LED lamp board or a mini LED lamp board. The driving substrate 110 is, for example, a printed circuit board or other suitable substrates, and its outermost surface may be selectively printed into black to increase contrast. The LED lamp boards 120 are placed on the driving substrate 110 by surface mount technology (SMT), and are electrically connected to the driving substrate 110.

Moreover, the LED lamp boards 120 of the embodiment respectively correspond to the accommodating grooves 132a of the transparent cover 130a and are arranged at intervals, where a material of the transparent cover 130a is, for example, epoxy resin or silicone glue, and a cross-sectional shape of each accommodating groove 132a is, for example, a rectangle, a regular trapezoid, an inverted trapezoid, a triangle, a semicircle, or a semiellipse. Here, the cross-sectional shape of the accommodating groove 132a in FIG. 1 is, for example, a rectangle. The LED lamp boards 120 and the blocking structure 140a disposed on the transparent cover 130a are disposed at intervals, where the blocking structure 140a is, for example, a black material, such as epoxy resin, silicon glue, or acrylic glue. Namely, neither the transparent cover 130a nor the blocking structure 140a in the embodiment is in contact with the LED lamp boards 120, and will not damage the LED lamp boards 120, and will not affect the luminous efficiency of the LED lamp boards 120, thereby improving a structural yield of the display module 100a of the embodiment.

Particularly, a thickness of each LED lamp board 120 is H, and a thickness T1 of the transparent cover 130a is, for example, within a range of 0.1H to 10H, which may be different according to the requirements of waterproof or impact protection ratings. In addition, a thickness T2 of the blocking structure 140a is, for example, within a range of 0.7H to 2H, which may be determined according to the requirements of optical characteristics. In addition, a length of each LED lamp board 120 is W, and a gap G between the blocking structure 140a and a side S of each LED lamp board 120 is, for example, less than or equal to 0.3 W. In one embodiment, the length W and a width of each LED lamp board 120 are respectively 0.4 millimeters (mm), and the thickness H of each LED lamp board 120 is 0.3 mm.

Since the transparent cover 130a and the blocking structure 140a of the embodiment are all arranged at intervals with the LED lamp boards 120, i.e., they are not in contact with the LED lamp boards 120, so that they will not damage the LED lamp boards 120, and will not affect the luminous efficiency of the LED lamp boards 120, thereby improving the structural yield of the display module 100a of the embodiment.

Figure 2A:
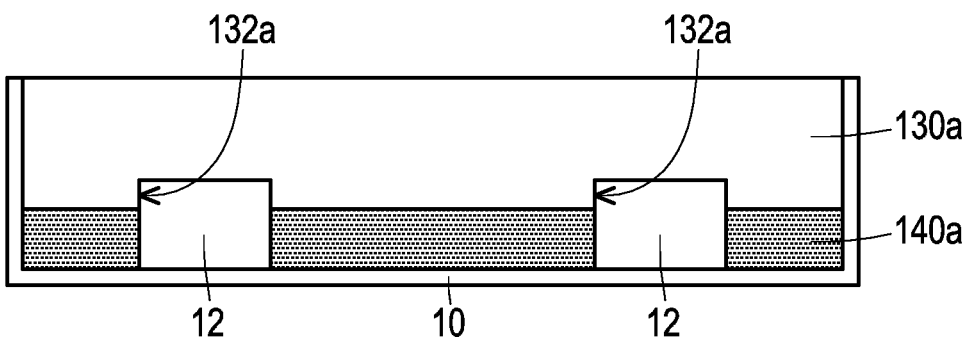
FIG. 2A and FIG. 2B are schematic diagrams of a manufacturing method of the display module shown in FIG. 1.
Figure 2B:
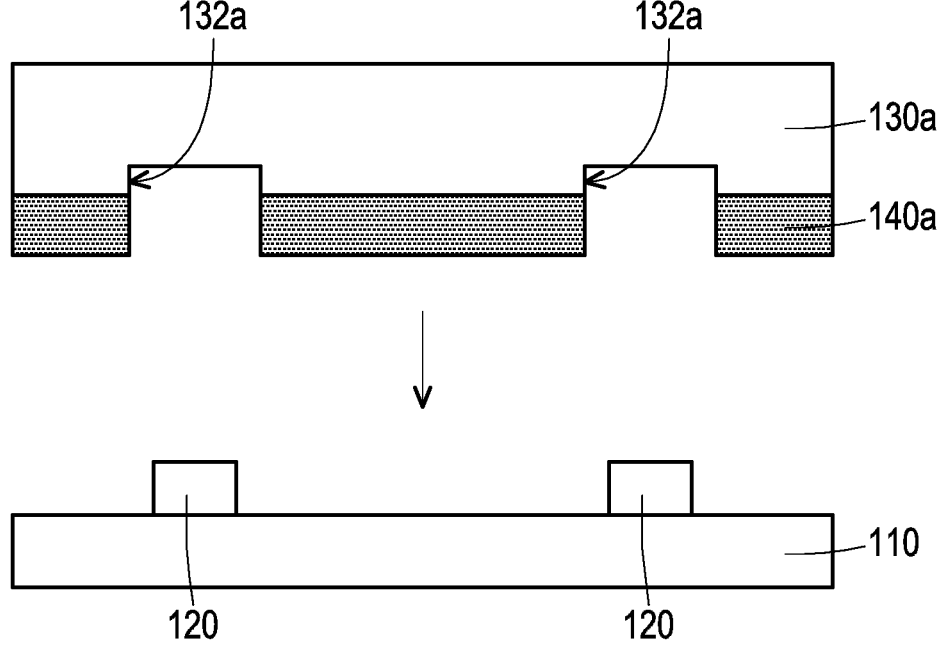

FIG. 2A and FIG. 2B are schematic diagrams of a manufacturing method of the display module shown in FIG. 1. In terms of a manufacturing process, referring to FIG. 2A, a mold 10 is provided, where the mold 10 has a plurality of protrusions 12. Then, the transparent cover 130a and the blocking structure 140a on the transparent cover 130a are formed with a double-layer glue. As shown in FIG. 2A and FIG. 2B, the protrusions 12 of the mold 10 may form the accommodating grooves 132a of the transparent cover 130a and the blocking structure 140*a* having multiple parts after demolding. Thereafter, referring to FIG. 2B, the driving substrate 110 and the LED lamp boards 120 are provided, where the LED lamp boards 120 are separately arranged on the driving substrate 110. Finally, the transparent cover 130*a* and the blocking structure 140*a* formed thereon by molding are assembled on the driving substrate 110, so that the LED lamp boards 120 respectively correspond to the accommodating grooves 132*a* and are arranged at intervals, where the blocking structure 140*a* is located between the transparent cover 130*a* and the driving substrate 110, and the LED lamp boards 120 and the blocking structure 140*a* are arranged at intervals. The method of assembling the transparent cover 130*a* on the driving substrate 110 may be implemented through gluing or other suitable methods, which is not limited by the disclosure. In this way, fabrication of the display module 100*a* in FIG. 1 is completed.

In brief, in the embodiment, the transparent cover 130*a* and the blocking structure 140*a* thereon are formed through the double-layer glue by pre-molding, i.e., through an off-line operation, so that compared with the prior art that requires two times of dispensing on the LED lamp boards, production efficiency and productivity of the manufacturing method of the display module 100*a* in the embodiment may be improved without affecting a production time. Furthermore, since the transparent cover 130*a* and the blocking structure 140*a* thereon are first manufactured through the off-line operation, and then assembled with the driving substrate 110 and the LED lamp boards 120 thereon, the problems of peeling-off of the LED lamp boards or deformation of the driving substrate caused by curing glue in the prior art may be avoided. In addition, neither the transparent cover 130*a* nor the blocking structure 140*a* formed in the embodiment is in contact with the LED lamp boards 120, and will not damage the LED lamp boards 120 and will not remain on a light-emitting surface of the LED lamp boards 120, thereby improving the production yield of the display module 100*a*.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 3:
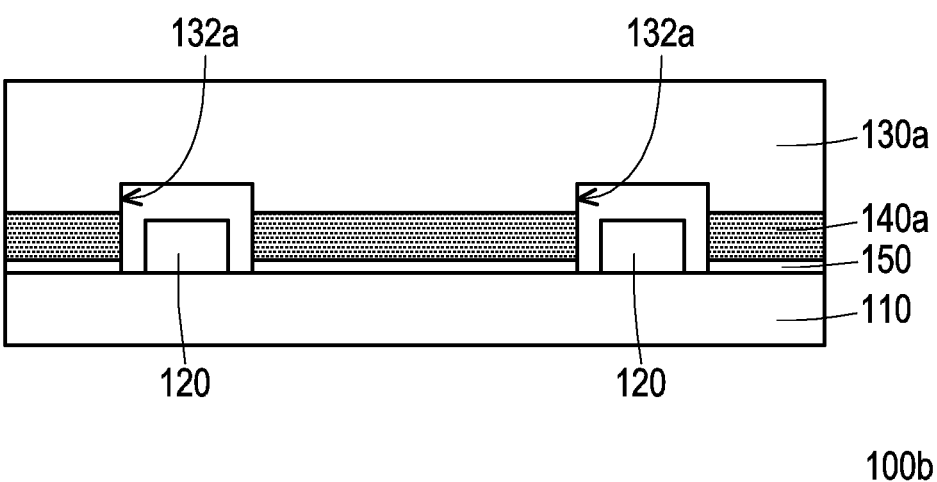
FIG. 3 is a schematic diagram of a display module according to another embodiment of the disclosure.

FIG. 3 is a schematic diagram of a display module according to another embodiment of the disclosure. Referring to FIG. 1 and FIG. 3 at the same time, a display module 100*b* of the embodiment is similar to the display module 100*a* of FIG. 1, and a difference there between is that in the embodiment, the display module 100*b* further includes an adhesive layer 150 disposed between the blocking structure 140*a* and the driving substrate 110, where the transparent cover 130*a* and the blocking structure 140*a* thereon are adhered and fixed on the driving substrate 110 through the adhesive layer 150.

In the manufacturing process, after the step in FIG. 2A, i.e., after the transparent cover 130*a* and the blocking structure 140*a* thereon are formed by pre-molding, and before the transparent cover 130*a* and the blocking structure 140*a* thereon are assembled on the driving substrate 110, the adhesive layer 150 may be first provided on the driving substrate 110 or the blocking structure 140*a*. Then, the transparent cover 130*a* and the blocking structure 140*a* thereon are assembled on the driving substrate 110 through the adhesive layer 150, so as to complete fabrication of the display module 100*b* in FIG. 3.

Since the transparent cover 130*a* and the blocking structure 140*a* thereon are fixed on the driving substrate 110 through the adhesive layer 150, when some of the LED lamp boards 120 are damaged and need to be repaired or replaced, the adhesive layer 150 may be peeled off by heating, so that the blocking structure 140*a* on the transparent cover 130*a* is separated from the driving substrate 110 to achieve the effect of rework.

Figure 4:
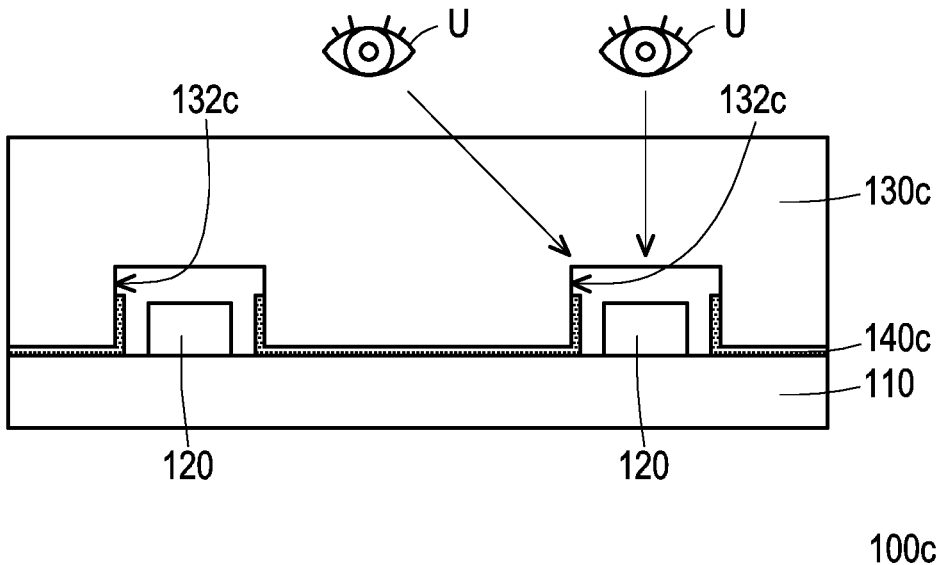
FIG. 4 is a schematic diagram of a display module according to another embodiment of the disclosure.

FIG. 4 is a schematic diagram of a display module according to another embodiment of the disclosure. Referring to FIG. 1 and FIG. 4 at the same time, a display module 100*c* in the embodiment is similar to the display module 100*a* in FIG. 1, and a difference there between is that in the embodiment, a blocking structure 140*c* is further extended on inner walls of accommodating grooves 132*c* of a transparent cover 130*c*. When a viewer U watches from the side of the transparent cover 130*c*, a better display contrast is presented.

Figure 5A:
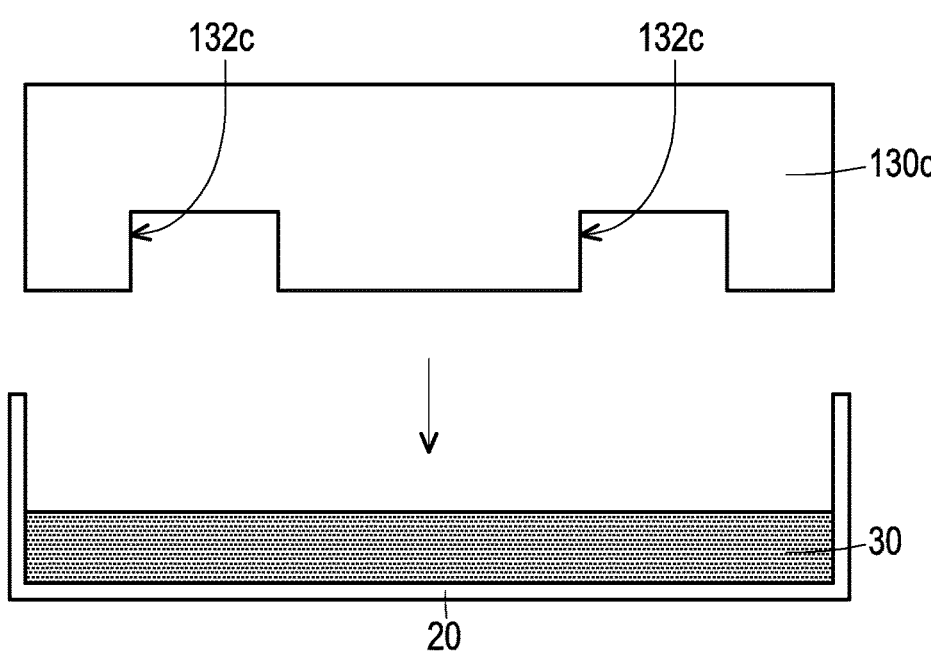
FIG. 5A and FIG. 5B are schematic diagrams of a manufacturing method of the display module shown in FIG. 4.
Figure 5B:
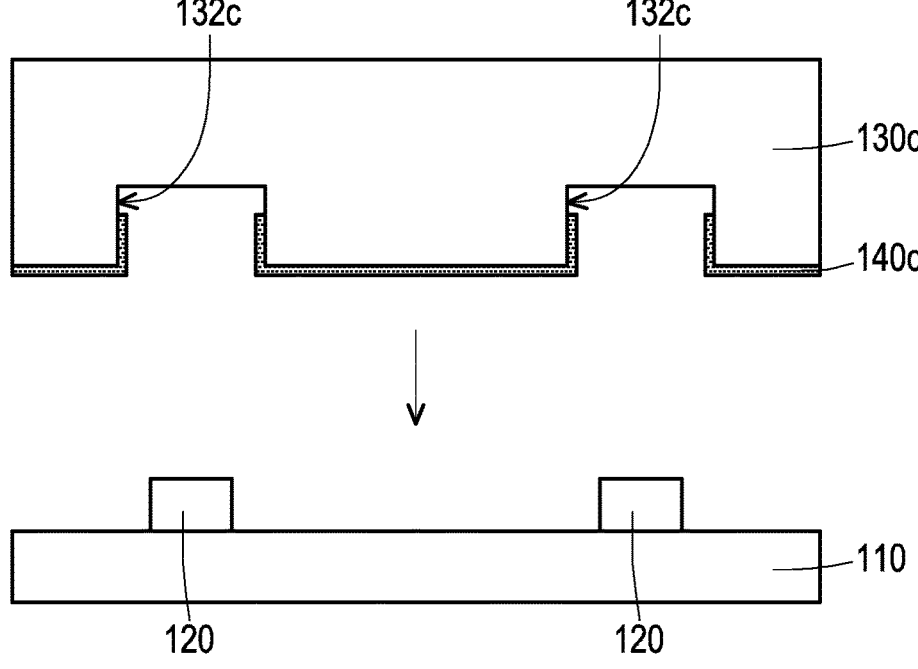

FIG. 5A and FIG. 5B are schematic diagrams of a manufacturing method of the display module shown in FIG. 4. In the manufacturing process, referring to FIG. 5A, a blocking material is provided in an accommodating groove 20. Then, the blocking material 30 is adhered to the transparent cover 130*c* formed through pre-molding, where the action of adhering may be repeated several times to form a predetermined thickness. Then, the blocking material 30 adhered to the transparent cover 130*c* is cured and the blocking structure 140*c* is formed on the transparent cover 130*c*. At this time, the blocking structure 140*c* is not only arranged on the surface of the transparent cover 130*c*, but also extended on the inner walls of the accommodating grooves 132*c*. Finally, the transparent cover 130*c* and the blocking structure 140*c* thereon are assembled to the driving substrate 110 to complete the fabrication of the display module 100*c* shown in FIG. 4.

In brief, in the embodiment, the transparent cover 130*c* is first formed by pre-molding, and then the transparent cover 130*c* is adhered with the blocking material 30 in the accommodating groove 20 to form the blocking structure 140*c* thereon, i.e., through the off-line operation. Therefore, compared with the on-line operation of the prior art that requires two times of dispensing on the LED lamp boards, the manufacturing method of the display module 100*c* of the embodiment may improve production efficiency and productivity without affecting production time. In addition, since the transparent cover 130*c* and the blocking structure 140*c* thereon are first manufactured through the off-line operation, and then assembled with the driving substrate 110 and the LED lamp boards 120 thereon, the problems of peeling-off of the LED lamp boards or deformation of the driving substrate caused by curing glue in the prior art may be avoided. In addition, neither the transparent cover 130*c* nor the blocking structure 140*c* formed in the embodiment is in contact with the LED lamp boards 120, and will not damage the LED lamp boards 120 and will not remain on the light-emitting surface of the LED lamp boards 120, thereby improving the production yield of the display module 100*c*.

Figure 6:
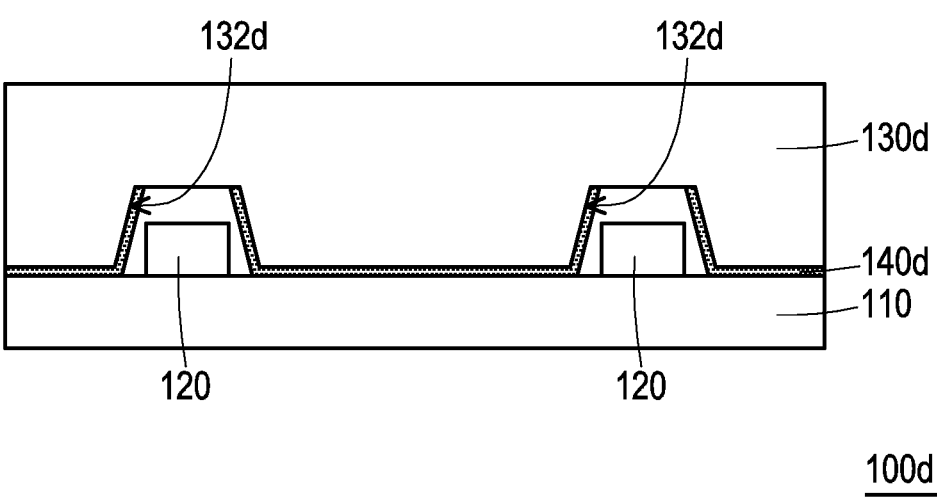
FIG. 6 is a schematic diagram of a display module according to another embodiment of the disclosure.

FIG. 6 is a schematic diagram of a display module according to another embodiment of the disclosure. Referring to FIG. 4 and FIG. 6 at the same time, a display module 100*d* of the embodiment is similar to the display module 100*c* of FIG. 4, and a difference there between is that in the embodiment, a cross-sectional shape of each accommodating groove 132*d* of a transparent cover 130*d* is, for example, a regular trapezoid, and a blocking structure 140*d* is disposed between the transparent cover 130*d* and the driving substrate 110 and further extended on the inner walls of the accommodating grooves 132*d*.

Figure 7:
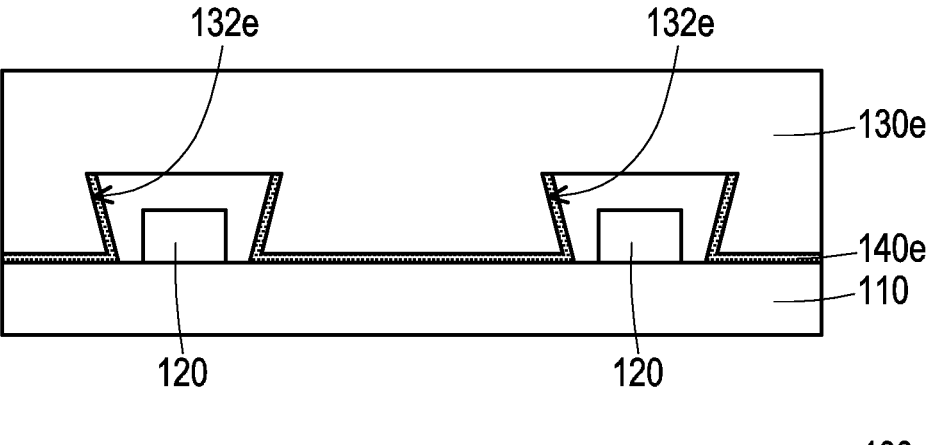
FIG. 7 is a schematic diagram of a display module according to another embodiment of the disclosure.

FIG. 7 is a schematic diagram of a display module according to another embodiment of the disclosure. Referring to FIG. 4 and FIG. 7 at the same time, a display module 100*e* of the embodiment is similar to the display module 100*c* of FIG. 4, and a difference there between is that in the embodiment, a cross-sectional shape of each accommodating groove 132*e* of a transparent cover 130*e* is, for example, a inverted trapezoid, and a blocking structure 140*e* is disposed between the transparent cover 130*e* and the driving substrate 110 and further extended on the inner walls of the accommodating grooves 132*e*. Since the accommodating groove 132*e* is large at the top and small at the bottom, when looking down from the top of the transparent cover 130*e*, an exposed area of the driving substrate 110 is smaller, so that the display module 100*e* may have better display quality.

In summary, in the design of the display module of the disclosure, the LED lamp boards respectively correspond to the accommodating grooves of the transparent cover and are arranged at intervals, and the LED lamp boards and the blocking structure disposed on the transparent cover are arranged at intervals. Namely, neither the transparent cover nor the blocking structure is in contact with the LED lamp boards, and will not damage the LED lamp boards, and will not affect the luminous efficiency of the LED lamp boards, thereby improving a structural yield of the display module of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A display module, comprising:
   a driving substrate;
   a plurality of light-emitting diode lamp boards, separately disposed on the driving substrate;
   a transparent cover, disposed on the driving substrate and having a plurality of accommodating grooves, the transparent cover comprising a plurality of first portions having a first thickness and a plurality of second portions corresponding to the plurality of accommodating grooves and having a second thickness, wherein the second thickness is less than the first thickness, and the light-emitting diode lamp boards respectively correspond to the accommodating grooves and are disposed at intervals; and
   a blocking structure, disposed on the plurality of first portions of the transparent cover and located between the transparent cover and the driving substrate, wherein the light-emitting diode lamp boards and the blocking structure are disposed at intervals.

2. The display module according to claim 1, wherein the blocking structure is further extended on inner walls of the accommodating grooves.

3. The display module according to claim 1, further comprising:
   an adhesive layer, disposed between the blocking structure and the driving substrate.

4. The display module according to claim 1, wherein a cross-sectional shape of each of the accommodating grooves comprises a rectangle, a regular trapezoid, an inverted trapezoid, a triangle, a semicircle, or a semiellipse.

5. The display module according to claim 1, wherein a thickness of each of the light-emitting diode lamp boards is H, and a thickness of the transparent cover is within a range of 0.1H to 10H.

6. The display module according to claim 1, wherein a thickness of each of the light-emitting diode lamp boards is H, and a thickness of the blocking structure is within a range of 0.7H to 2H.

7. The display module according to claim 1, wherein a length of each of the light-emitting diode lamp boards is W, and a gap between the blocking structure and a side of each of the light-emitting diode lamp boards is less than or equal to 0.3 W.

8. The display module according to claim 1, wherein a material of the transparent cover comprises epoxy resin or silicone glue.

9. The display module according to claim 1, wherein a material of the blocking structure comprises epoxy resin, silicon glue, or acrylic glue.

10. The display module according to claim 1, wherein each of the light-emitting diode lamp boards comprises a micro light-emitting diode lamp board or a mini light-emitting diode lamp board.

* * * * *